Figure 1:
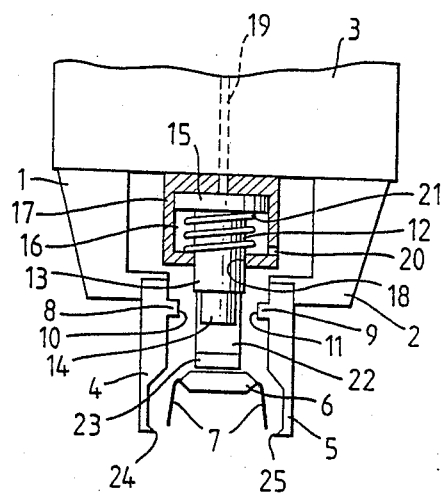

United States Patent [19]

Vermeer et al.

[11] Patent Number: 4,822,091
[45] Date of Patent: Apr. 18, 1989

[54] GRIPPING DEVICE

[75] Inventors: Adrianus J. P. M. Vermeer; Johannes T. A. Van de Ven, both of Eindhoven, Netherlands

[73] Assignee: U.S. Philips Corporation, New York, N.Y.

[21] Appl. No.: 171,043

[22] Filed: Mar. 21, 1988

[30] Foreign Application Priority Data

Apr. 6, 1987 [GB] United Kingdom ............... 8708154

[51] Int. Cl.$^4$ ..................... B65G 47/91; H05K 3/30
[52] U.S. Cl. ..................... 294/86.4; 29/740; 29/743; 81/341; 294/106; 294/119.1
[58] Field of Search ............. 29/740, 743, 741, 762, 29/764, 758; 294/2, 86.4, 64.1, 119.1, 106; 81/341

[56] References Cited

U.S. PATENT DOCUMENTS 2,932,224 4/1960 Peed, Jr. et al. ............... 81/341 X
4,610,473 9/1986 Hawkswell ..................... 294/64.1

*Primary Examiner*—Carl E. Hall

[57] ABSTRACT

A gripping device for an apparatus for placing electronic and/or electrical components, in particular DIL components, on a substrate comprises a pair of grippers (1 and 2) which are movable towards and away from one another to close and open the jaws (4 and 5) of the grippers. To enable the device to handle components of different widths without the risk of damaging the terminal pins of the components, a stop member in the form of a vertically disposed stepped pin 12 is provided between the grippers for abutment by horizontally extending rib-like projections (8 and 9) on the inner sides of the gripper jaws to limit movement of the grippers in the closing direction. The portions of the pin that are separated by the step (or steps) have different diameters corresponding to the different widths of component that the device is required to handle, and the pin is coaxially adjustable by fluid-pressure operated means in the form of a piston (15) to bring the portions of the pin selectively into an operative position between the projections on the gripper jaws for engagement by these projections to determine a closed position of the jaws for a particular width of component.

9 Claims, 1 Drawing Sheet

GRIPPING DEVICE

DESCRIPTION

The invention relates to a gripping device for an apparatus for placing electronic and/or electrical components on a substrate, for example, a printed-circuit board. Such an apparatus is described in U.S. Pat. No. 4,664,591 which corresponds to European Patent Application No. 0 183 301. The invention relates particularly to a gripping device comprising a pair of grippers, each of which comprises a gripper jaw and which are movable towards and away from one another to close and open the jaws for gripping and releasing a component. The grippers may be moved by fluid-pressure operated means or by electrically operated means.

The invention relates particularly to a gripping device for handling DIL (Dual in-line) components. Such a component, which may be a package containing, for example, an integrated circuit, has two substantially parallel rows of metal terminal pins projecting downwardly from the body of the component for insertion in holes in the substrate on which the component is to be mounted. The component is supplied to the pick-up position, i.e., the position where it is to be picked up by the gripping device, with the pins of the two rows diverging slightly in the downward direction so that the distance between the two rows of pins at the free ends of the pins is slightly greater than the distance between the two rows of holes in which the pins are to be inserted. At the pick-up position the component is gripped by the jaws of the gripping device at the outer sides of the pins and the grippers are arranged to be moved in the closing direction until the pins have been deflected inwardly by the jaws sufficiently to bring the free ends of the pins to positions such that the distance between the two rows of pins at the free ends of the pins is substantially equal to the distance between the respective rows of holes in the substrate. When the pins have subsequently been inserted in these holes and the component released by the gripping device, the pins tend under their resilience to resume their original divergence and consequently press against the walls of the holes to hold the component in position while soldering of the pins in the holes takes place.

It is as object of the invention to provide a gripping device which can handle components of different widths, the width of a component being understood to be the distance between the two rows of terminal pins of the component when the pins are in their prescribed positions for insertion in the relevant holes in a substrate.

According to the invention there is provided a gripping device for an apparatus for placing electronic and/or electrical components on a substrate, the device comprising a pair of grippers, each of which comprises a gripper jaw and which are movable towards and away from one another to close and open the jaws for gripping and releasing a component, characterised in that a stop member is provided in the gripping device for abutment on two opposite sides by surfaces of the two grippers to limit movement of the grippers in the closing direction, the stop member being adjustable to bring different portions thereof selectively into an operative position between surfaces of the grippers for engagement by these surfaces, said different portions of the stop member having different widths measured between the two opposite sides of each portion which are engageable by said surfaces of the grippers in said operative position.

The different widths of the different portions of the stop member correspond to different widths of component. When a component of a particular width is to be picked up by the gripping device and placed on a substrate, the stop member will be adjusted to bring the portion thereof which corresponds to that width of component to the operative position. When the grippers close they will abut this portion of the stop member and will remain in abutment therewith until they are opened again after the component has been placed on the substrate. The closing force acting on the grippers when the gripper jaws have closed on the component will therefore be taken by the stop member and not by the terminal pins of the component, which remain held by the jaws under the influence of their own resilience. Thus, the risk of damage to the pins is avoided.

A simple form of stop member comprises a pin which is stepped to form a number of coaxial portions of different diameters which constitute said different portions of the stop member.

One embodiment of the invention is characterised in that the stop member is adjustable by fluid-pressure operated means. This can be of considerable advantage if the movement of the grippers also is effected by fluid-pressure operated means since the same source of fluid pressure can be used to supply both the means for actuating the grippers and the means for adjusting the stop member. The latter means may comprise a piston with the stop member in the form of a stepped pin connected coaxially to it.

Another embodiment of the invention is characterised in that the stop member is mounted on one end of an arm which is pivotally supported intermediate its ends to permit movement of the stop member for the adjustment thereof, and in that for effecting this adjustment there is provided a number of interchangeable abutments each corresponding to an associated one of said different portions of the stop member and which are adapted to be selectively mounted in a fixed position in relation to movements of the gripping device in the use of the device, for engagement by the end of said arm remote from the stop member during movement of the gripping device towards a position for picking up a component, so that the arm is pivoted by the selected abutment to bring the associated one of said portions of the stop member into the operative position.

The interchangeable abutments may simply comprise pins of different lengths adapted to be selectively mounted in a vertical position adjacent the pick-up position.

Figure 2:
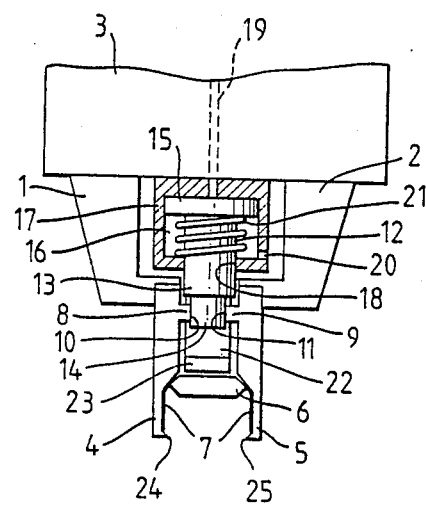
Figure 3:
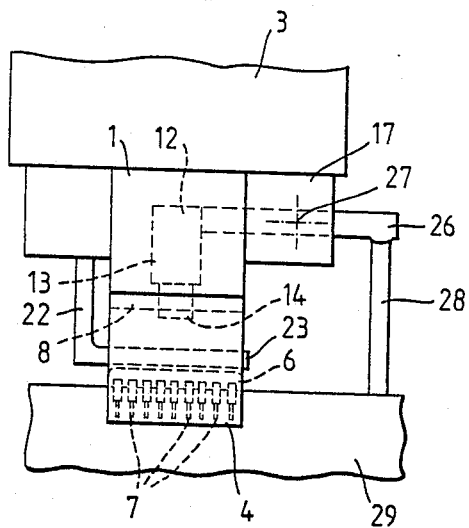

Embodiments of the invention will now be described by way of example with reference to the accompanying drawings, in which FIGS. 1 and 2 are side views, partly in section, of a first embodiment, showing the gripper jaws open and closed, respectively, and FIG. 3 is a view of a second embodiment looking in a direction at right angles to the viewing direction in FIGS. 1 and 2.

Like parts in the two embodiments are designated by the same reference numerals.

The gripping device shown in FIGS. 1 and 2 comprises a pair of grippers 1 and 2 supported in a mounting 3 which is adapted to be fitted in an apparatus for placing electronic and/or electrical components on a substrate, for example, an apparatus similar to that described in the present Applicants' European Patent Application No. 0 183 301. The grippers 1 and 2 comprise jaws 4 and 5 which are shaped to grip a DIL component, for example, the component 6 in the drawings, at the outer sides of the terminal pins 7 of the component, which are arranged in two substantially parallel rows. The grippers are movably supported in the mounting 3 for translational movement towards and away from each other to close and open the jaws. The movement of the grippers is effected preferably by fluid-pressure operated means, which may be of any convenient known form and therefore need not be illustrated or described in detail. These means, which are accommodated in the mounting 3, may comprise, for example, a single- or double-acting piston or pistons operated by compressed air or vacuum or by hydraulic pressure. In the case of a single-acting piston or pistons each of the grippers 1 and 2 is moved in one direction by compressed air or vacuum or by hydraulic pressure and in the opposite direction by a spring; with a double-acting piston or pistons each gripper is moved in both directions by compressed air or vacuum or by hydraulic pressure.

On the inner sides of the gripper jaws 4 and 5 are two rib-like projections 8 and 9, respectively, with surfaces 10 and 11, respectively, which face one another. Between these surfaces is disposed a stop member 12 in the form of a cylindrical pin which is arranged with its longitudinal axis perpendicular to the direction of movement of the grippers 1 and 2 and which is stepped to form a number of coaxial portions of different diameters. The number of portions will depend on the number of different widths of component that the gripping device is required to handle. In the present embodiment there are only two portions, designated 13 and 14, respectively. The stop member is adjustable axially to bring one or the other of the portions 13 and 14 selectively into an operative position between the surfaces 10 and 11 of the projections 8 and 9 on the gripper jaws 4 and 5 for abutment by these surfaces when the grippers 1 and 2 are moved towards one another to close the jaws. In FIGS. 1 and 2 the portion 14 of smaller diameter is in the operative position. When the grippers are moved to close the jaws 4 and 5 the surfaces 10 and 11 will abut the portion 14 of the stop member on opposite sides thereof to limit the closing movement of the grippers. Thus, the distance between the gripper jaws in the closed position is determined by the width of the portion of the stop member which is in the operative position, the width being the distance between the two opposite sides of said portion that are engaged by the surfaces 10 and 11 of the projections on the gripper jaws. In the present embodiment with width is the diameter of the relevant portion of the stop member.

If the gripping device is to pick-up a component having the larger width, the stop member 12 is moved down to bring its wider portion 13 to the operative position. In the embodiment shown in FIGS. 1 and 2 the stop member is moved by fluid-pressure operated means in the form of a piston 15 to which the stop member is coaxially connected at its upper end and which is slidable in a vertical direction in a cylindrical chamber 16 in a part 17 of the mounting 3 that projects downwardly between the grippers 1 and 2. The stop member 12 is slidably guided in a bore 18 in the part 17. A duct 19 is provided in the mounting 3 for the admission of compressed air to the upper part of the chamber 16 to move the piston 15 downwards, the chamber being open to atmosphere beneath the piston through a port 20 in the wall of the chamber and a coil spring 21 being arranged beneath the piston to urge it upwards to that the stop member 12 normally has its narrower portion 14 in the operative position, as shown in FIGS. 1 and 2. It would, of course, be possible to arrange the spring 21 and the duct 19 and port 20 so that the stop member 12 is normally held with its wider portion 13 in the operative position and the piston 15 is moved upwards by compressed air to bring the narrower portion 14 of the stop member to the operative position. By means of a suitable control valve (not shown) the upper end of the chamber 16 in the arrangement shown can be placed in communication either with a source of compressed air or with atmosphere. If the grippers 1 and 2 are actuated by compressed air, the piston 15 can conveniently be operated by compressed air from the source which supplies the air for operating the piston or pistons by which the grippers are actuated. If the grippers are actuated by vacuum or hydraulic pressure instead of compressed air, it would be a simple matter to arrange for the adjustment of the stop member 12 to be effected by means of a vacuum-operated or a hydraulically operated piston.

The components which are to be placed on the appropriate substrate by means of the gripping device shown in FIGS. 1 and 2 are fed one at a time to a pick-up position with the pins of the two rows of terminal pins of each component diverging slightly in the downward direction as shown in FIG. 1. The gripping device is lowered to the pick-up position with the gripper jaws 4 and 5 open, as shown in FIG. 1, and with the stop member 12 adjusted to the position corresponding to the width of the component at the pick-up position. The grippers 1 and 2 are then actuated to close the jaws 4 and 5 until the surfaces 10 and 11 of the projections 8 and 9 on the jaws abut the operative portion of the stop member, i.e., the portion which is in the operative position, in the present case the portion 14. The gripper jaws are constructed so that when they are closed against the operative portion of the stop member with a component of the width corresponding to that portion gripped between them, as shown in FIG. 2, the two rows of pins of the component will lie in parallel planes spaced apart by a distance equal to the distance between the two rows of holes in the substrate in which the pins are to be inserted. The free ends of the pins will then, when the component is positioned by the gripping device above the place where it is to be mounted on the substrate, be aligned with the respective holes. The component is pushed down to insert the pins in the holes by a pusher element 22 in the form of an L-shaped bar which is supported in the mounting 3 and which is movable therein in the vertical direction by any convenient known means. The horizontal limb 23 of the pusher element extends between the gripper jaws 4 and 5 and is arranged to engage the upper side of the body of the component as the pusher element is moved downwards. During their insertion into the holes in the substrate the pins are guided in known manner in grooves or recesses (not shown) formed in inwardly directed lips 24 and 25 at the lower edges of the gripper jaws 4 and 5.

In the embodiment shown in FIG. 3 the stop member 12 is mounted on one end of an arm 26 which is supported intermediate its ends in the part 17 of the mounting 3 for pivotal movement about a horizontal axis 27. A light spring is arranged to urge the stop member to an upper position. The end of the arm 26 remote from the stop member is so arranged that as the gripping device descends to the pick-up position this end of the arm engages an abutment formed by the upper end of a pin 28 mounted adjacent the pick-up position and the arm is thereby pivoted to move the stop member 12 downwards relative to the grippers 1 and 2 and bring one or the other of the portions 13 and 14 of the stop member to the operative position. Which portion is brought to this position depends on the height of the pin 28, which height corresponds to the width of the component at the pick-up position. The pin 28 is removable so that it can be interchanged with a pin of a different height. The pin may form part of an interchangeable unit which also comprises a part 29 for supporting the component at the pick-up position.

In either of the above embodiments the stop member may comprise a body of conical or frusto-conical form instead of a stepped pin.

What is claimed is:

1. A gripping device for an apparatus for placing electrical components on a substrate, the device comprising a pair of grippers, each of which comprises a gripper jaw and which are movable towards and away from one another to close and open the jaws for gripping and releasing a component, each said jaw having a surface, characterized in that a stop member is provided in the gripping device for abutment on two opposite sides by the surfaces of the two grippers to limit the movement of the grippers in the closing direction, said stop member having two portions and being adjustable to bring either of said two portions thereof selectively into an operative position between said surfaces of the grippers for engagement by said surfaces, said different portions of the stop member having different widths measured between the two opposite sides of each portion which are engageable by said surfaces of the grippers in said operative position whereby said grippers can be stopped by abutment in two different gripping positions.

2. A gripping device as claimed in claim 1, characterised in that the stop member comprises a pin which is stepped to form said two portions of different widths.

3. A gripping device as claimed in claim 1, including fluid pressure operating means for adjusting said stop member.

4. A gripping device as claimed in claim 1 characterised in that the fluid-pressure operated means comprises a piston and said pin is coaxially connected to said piston.

5. A gripping device as claimed in claim 1, characterised in that the stop member is mounted on one end of an arm which is pivotally supported intermediate its ends to permit movement of the stop member for the adjustment thereof, and in that for effecting this adjustment there is provided a number of interchangeable abutments each corresponding to an associated one of said different portions of the stop member and which are adapted to be selectively mounted in a fixed position in relation to movements of the gripping device in the use of the device, for engagement by the end of said arm remote from the stop member during movement of the gripping device towards a position for picking up a component, so that the arm is pivoted by the selected abutment to bring the associated one of said portions of the stop member into an operative position.

6. A gripping device as claimed in claim 5, characterised in that the interchangeable abutments comprise pins of different lengths.

7. A gripping device as claimed in claim 2, including fluid pressure operating means for adjusting said stop members.

8. A gripping device as claimed in claim 2, characterised in that the stop member is mounted on one end of an arm which is pivotally supported intermediate its ends to permit movement of the stop member for the adjustment thereof, and in that for effecting this adjustment there is provided a number of interchangeable abutments each corresponding to an associated one of said different portions of the stop member and which are adapted to be selectively mounted in a fixed position in relation to movements of the gripping device in the use of the device, for engagement by the end of said arm remote from the stop member during movement of the gripping device towards a position for picking up a component, so that the arm is pivoted by the selected abutment to bring the associated one of said portions of the stop member into an operative position.

9. A gripping device as claimed in claim 8, characterised in that the interchangeable abutments comprise pins of different lengths.

* * * * *